United States Patent
Tsuda

(10) Patent No.: US 12,338,523 B2
(45) Date of Patent: Jun. 24, 2025

(54) METHOD FOR PATTERNING A SUBSTRATE, A METHOD FOR FORMING A MICROSTRUCTURE ON A SUBSTRATE, AND A METHOD FOR FABRICATING A FLUIDIC DEVICE

(71) Applicant: CRAIF INC., Tokyo (JP)

(72) Inventor: Keishu Tsuda, Nagoya (JP)

(73) Assignee: CRAIF INC., Tokyo (JP)

( * ) Notice: Subject to any disclaimer, the term of this patent is extended or adjusted under 35 U.S.C. 154(b) by 0 days.

(21) Appl. No.: 18/682,253

(22) PCT Filed: Aug. 8, 2022

(86) PCT No.: PCT/JP2022/030233
§ 371 (c)(1),
(2) Date: Feb. 8, 2024

(87) PCT Pub. No.: WO2023/017801
PCT Pub. Date: Feb. 16, 2023

(65) Prior Publication Data
US 2024/0376587 A1    Nov. 14, 2024

(30) Foreign Application Priority Data

Aug. 11, 2021    (JP) .................. 2021-131490

(51) Int. Cl.
*C23C 14/04* (2006.01)
*B01L 3/00* (2006.01)
(Continued)

(52) U.S. Cl.
CPC ...... *C23C 14/042* (2013.01); *B01L 3/502707* (2013.01); *C23C 14/14* (2013.01);
(Continued)

(58) Field of Classification Search
CPC ......... C23C 14/02; C23C 14/14; C23C 14/34; C23C 14/5853; B01L 3/502707;
(Continued)

(56) References Cited

U.S. PATENT DOCUMENTS

2004/0241896 A1* 12/2004 Zhou .................... B82Y 30/00
430/5
2012/0273828 A1* 11/2012 Wei .................... H01L 21/0237
257/E33.066

FOREIGN PATENT DOCUMENTS

JP        H6-61160 A       3/1994
JP       2000147792 A      5/2000
(Continued)

OTHER PUBLICATIONS

Machine Translation JP 2019-523640 (Year: 2019).*
(Continued)

*Primary Examiner* — Rodney G McDonald
(74) *Attorney, Agent, or Firm* — McBee, Moore & Vanik IP, LLC

(57) ABSTRACT

According to an embodiment of the present disclosure, a method for patterning a substrate is provided. In some embodiments, the method includes patterning a hydrophobic film formed on a surface of a substrate, applying a target material, and oxidizing at least the surface of the applied target material. In some embodiments, the method further includes removing the hydrophobic film from the substrate.

12 Claims, 4 Drawing Sheets

(51) Int. Cl.
  *C23C 14/14* (2006.01)
  *C23C 14/34* (2006.01)
  *C23C 14/58* (2006.01)
(52) U.S. Cl.
  CPC .......... *C23C 14/34* (2013.01); *C23C 14/5853* (2013.01); *B01L 2200/0647* (2013.01); *B01L 2200/12* (2013.01); *B01L 2300/12* (2013.01); *B01L 2300/161* (2013.01)
(58) Field of Classification Search
  CPC ......... B01L 2200/0647; B01L 2200/12; B01L 2300/12; B01L 2300/161
  USPC .................................................. 204/192.15
  See application file for complete search history.

(56) References Cited

FOREIGN PATENT DOCUMENTS

| | | |
|---|---|---|
| JP | 2002169303 A | 6/2002 |
| JP | 2013182046 A | 9/2013 |
| JP | 2016010965 A | 1/2016 |
| JP | 2016157111 A | 9/2016 |
| JP | 2019523640 A | 8/2019 |

OTHER PUBLICATIONS

International Search Report and Written Opinion for PCT/JP2022/030233, issued Sep. 13, 2022. (Translation of ISR included).

\* cited by examiner

METHOD FOR PATTERNING A SUBSTRATE, A METHOD FOR FORMING A MICROSTRUCTURE ON A SUBSTRATE, AND A METHOD FOR FABRICATING A FLUIDIC DEVICE

CROSS-REFERENCE TO RELATED APPLICATIONS

This application is the National Stage entry of International Application No. PCT/JP2022/030233, filed 8 Aug. 2022, which claims priority to Japan No. 2021-131490, filed 11 Aug. 2021. The contents of which are included herein in their entirety.

BACKGROUND

Field of Invention

The present disclosure relates to a method for patterning a substrate, a method for forming a microstructure on a substrate, and a method for fabricating a fluidic device.

Description of Related Art

In the fields of using microfabrication techniques, including biotechnology and semiconductors, microstructures or structures are formed on surfaces of substrates, such as wafers. Such a structure is formed partially or discretely on a surface of a substrate. On another portion of the surface of the substrate, no microstructure is formed, and the surface of the substrate is substantially exposed.

However, in many cases, due to the influence of microfabrication or its processing process, structures or substances, such as processing debris, particles or chemical contaminants, or growth or formation of non-specific substances, that are not necessarily desired are formed on or attached to the exposed substrate surface. In some cases, it is desired that a portion of the surface of the substrate on which no microstructures have been formed (the portion may be the surface of the original substrate or the surface of a film or layer disposed on the surface of the original substrate) be maintained or restored as clean as possible.

As an example, there is a fluidic device including a microstructure in a flow channel. To arrange the microstructure in the flow channel, the microstructure is formed on the surface of the substrate, and a cover is brought into close contact with the surface of the substrate. Here, a portion of the substrate surface with which the cover is brought into close contact must be free of a microstructure. The presence of an unwanted, accidentally formed microstructure, a contaminant such as particles, or the like can inhibit close contact between a portion of the surface of the substrate and the cover to deteriorate the sealing of the fluid contained therein.

SUMMARY OF THE INVENTION

Technical Problem

Desired is a method to avoid the formation or deposition of structures or materials that are not necessarily desired, such as processing debris, particles, or chemical contaminants, or the growth or formation of non-specific materials when a substrate is subjected to a process such as patterning or microstructure formation.

Solution to Problem

According to an embodiment of the present disclosure, a method for patterning a substrate is provided. In some embodiments, the method includes patterning a hydrophobic film formed on a surface of a substrate, applying a target material, and oxidizing at least a surface of the applied target material.

In some embodiments, the method further includes removing the hydrophobic film from the substrate.

<Substrate>

The term "substrate" used in this specification typically refers to a freely-selected substrate or a material surface formed on a substrate on which film processing is performed during a fabrication process. A surface of the substrate that can be subjected to processing contains a material, such as silicon (Si), silicon oxide ($SiO_2$), silicon-on-insulator (SOI), germanium (Ge), gallium arsenide (GaAs), glass, or sapphire. The surface of the substrate contains a semiconductor material or material commonly used in a semiconductor process. The surface of the substrate contains another material, such as a metal, a metal oxide, a metal alloy, or another conductive material, in accordance with the application. The surface of the substrate contains a polymer material. On the surface of the substrate, an oxide, a fat component, or the like may be present at an atomic level or a micro level. The substrate includes, but is not limited to, a semiconductor wafer, such as a silicon wafer, a glass wafer, or a polymer film. The substrate may be subjected to a pretreatment process to polish, etch, reduce, oxidize, hydroxylate, anneal, clean, and/or bake the substrate surface. The surface of the substrate contains such a material as a basic constituent material, and may contain impurities or include a surface layer when handled in the atmosphere or in a clean room environment, for example.

In some embodiments, the surface of the substrate may be partially or entirely hydrophobic. In some embodiments, the surface of the substrate may be partially or entirely hydrophilic.

The surface of the substrate may be substantially planar. The surface of the substrate may include a flat surface. After at least the hydrophobic film is removed, the portion of the surface of the substrate may be flat. The portion of the surface of the substrate can be bonded to a member that defines a flow channel, thus creating a fluid-tight seal for the flow channel.

The surface of the substrate may have a surface roughness of 5, 4, 3, 2, 0.5, 0.4, 0.3, 0.2, 0.1, 0.9, 0.8, 0.7, 0.6, 0.5, 0.4, 0.3, 0.2, or 0.1 nm Ra, or less than any of them. The surface of the substrate may have a surface roughness comparable to a commercially available or industrially usable substrate. For example, a commercially available silicon substrate, a glass substrate, or a polymer substrate, or a film may be used.

<Hydrophobic Film>

The term "hydrophobic film" used in this specification refers to a film composed of a material having hydrophobicity (hydrophobic material, the same applies hereinafter) or containing a material having hydrophobicity on a surface thereof. The hydrophobic film may contain a fluorine compound or a resin. The hydrophobic film may be what is called a fluororesin film.

The hydrophobic material may be selected from the group consisting of fluorinated polymers, fluorocarbon polymers, silicon polymers, and mixtures thereof. Examples of the hydrophobic material include amorphous fluoropolymers (commercially available examples include the CYTOP (registered trademark) series, available from AGC Chemicals, having one of the following terminal functional groups. Examples thereof include those having one of the following terminal functional groups: A-type: —COON, M-type: —CONH—Si(OR), and S-type: —CF$_3$); polytetrafluoroethylene (commercially available examples include TEFLON (registered trademark) from Chemours); parylene; fluorinated hydrocarbons; fluoroacrylic copolymers (commercially available examples include FLUOROPEL (registered trademark) from Cytonix); fluorosilanes (such as trichloro (1H,1H,2H,2H-perfluorooctyl)silane (PFOTS) and perfluorodecyltrichlorosilane (FDTS); plasma-deposited fluorocarbons; polydimethylsiloxanes; other siloxanes; hydrophobic hydrocarbons such as 1-heptadecyne; and mixtures thereof.

The hydrophobic material may be applied to at least part of the surface or the entire surface of the substrate. The hydrophobic material may be applied to the surface of the substrate by a dry or wet process. For example, the hydrophobic material may be dropped and spin-coated on the surface of the substrate in a solution state. Then the hydrophobic material may be dried, heat treated, or baked.

In some embodiments, the hydrophobic film formed on the surface of the substrate is patterned. In some embodiments, the hydrophobic film may be patterned using a photolithographic technique. A resist is applied to a surface of the hydrophobic film with a spin coater or by spraying, prebaked, exposed to light, and developed. Thereby, the resist is patterned. The hydrophobic film is exposed at a location where the resist is removed. After the development, treatment such as rinsing and post-baking may be performed.

In some embodiments, patterning may include performing etching with a hard mask (e.g., a metal mask).

<Etching>

In some embodiments, the exposed surface of the hydrophobic film is subjected to an etching process. Thereby, the hydrophobic film is patterned in correspondence with the pattern of the resist. An example of the etching of the hydrophobic film may be, but not particularly limited to, oxygen etching. Thus, the surface of the substrate is exposed.

In some embodiments, a target material is applied to the exposed surface of the substrate. The target material may be applied to the entire substrate, i.e., the surface of the resist. A film containing or consisting essentially of the target material may be formed.

<Target Material>

Examples of the target material include gold, platinum, aluminum, copper, iron, cobalt, silver, tin, indium, zinc, gallium, chromium, and oxides thereof. The target material may be an oxidizable material. The target material may be chromium (Cr). The target material may be zinc oxide (ZnO).

<Removal of Photoresist>

In some embodiments, the photoresist may be removed after the application of the target material. At this time, the target material applied to the surface of the photoresist may be removed together. This process may be referred to as a lift-off process. During the lift-off process, the hydrophobic film and the patterned target material may remain on the surface of the substrate.

<Treatment of Target Material>

In some embodiments, treatment may be performed on the applied target material. The treatment may be treatment for the surface of the target material. The treatment may be heating. Heating may include, for example, heating the substrate in a furnace or irradiating the target material or substrate with a laser. The treatment may be oxidation of at least the surface, or the whole or part of the volume of the target material. Examples of the oxidation include heating in an oxidizing atmosphere and plasma treatment.

In some embodiments, the target material may be processed or treated. For example, a microstructure may be formed on the surface of the target material. The microstructure may be formed by etching the target material. In some embodiments, the microstructure may be formed on the surface of the target material. For example, a member for forming a microstructure may be grown on the surface of the target material.

<Nanowire>

In some embodiments, a nanowire may be formed on the surface of the target material. For example, particles or a catalyst for growing the nanowire may be applied to a surface of a target material, and the nanowire may be grown from the surface as a starting point. In some embodiments, the target material may be a material that can catalyze the growth of the nanowire or that can serve as a starting point for nanowire growth.

Examples of the particles or a seed layer for forming the nanowire include ZnO and CrO. A nanowire using ZnO can be grown on the surface of any of these seed materials using a hydrothermal synthesis method. In an embodiment, ZnO is first applied to a surface of the substrate (the surface of the target material). Next, the substrate is immersed in a precursor solution in which zinc nitrate hexahydrate ($Zn(NO_3)_2 \cdot 6H_2O$) and hexamethylenetetramine ($C_6H_{12}N_4$) are dissolved in deionized water. Thus, a ZnO nanowire can be grown on the surface of the target material. When ZnO is used as the target material, ZnO serves as particles for forming a nanowire. Therefore, it is not necessary to separately apply ZnO to the surface of the target material.

Examples of the catalyst for producing a nanowire include gold, platinum, aluminum, copper, iron, cobalt, silver, tin, indium, zinc, gallium, chromium, and titanium.

A nanowire using a catalyst can be produced by the following procedure.

(a) The catalyst is deposited on the surface of the target material.
(b) The nanowire is formed by a physical vapor deposition method, such as pulsed laser deposition or a vapor-liquid-solid (VLS) method using a material, such as $SiO_2$, $Li_2O$, $MgO$, $Al_2O_3$, $CaO$, $TiO_2$, $Mn_2O_3$, $Fe_2O_3$, $CoO$, $NiO$, $CuO$, $ZnO$, $GazO_3$, $SrO$, $In_2O_3$, $SnO_2$, $Sm_2O_3$, or $EuO$. The nanowire formed using a catalyst may be a nanowire having no branched chain or a nanowire having a branched chain.

In some embodiments, a covering layer may be formed on the surface of the nanowire. The covering layer can be formed by a vapor deposition method, such as sputtering, electron beam (EB) vapor deposition, physical vapor deposition (PVD), or an atomic layer deposition (ALD).

In some aspects, the covering layer may be composed of a material having a high thermal conductivity. For example, a device including a nanowire having such a covering layer can be used for heat-treating a sample. In some aspects, the covering layer may be composed of a material that can bind a peptide and/or nucleic acid and that has a high thermal conductivity. Thus, the surface of the nanowire can be modified with a peptide and/or a nucleic acid. The modified nanowire has the ability to efficiently capture or separate biomolecules from other substances. These are merely examples, and the material used for the covering layer is not limited thereto.

<Lift-Off>

In some embodiments, the hydrophobic film may be removed after processing of the target material, e.g., after processing, such as the heating or oxidation of the target material, or the formation of a microstructure. The hydrophobic film may be removed by the lift-off process.

The hydrophobic film subjected to the heating or oxidation treatment is typically fragile. When the substrate is immersed in water and heated at a predetermined temperature, the hydrophobic film is peeled off from the substrate. At this time, removal of the hydrophobic film may be accelerated by, for example, ultrasonic cleaning.

The hydrophobic film is then removed, thereby preparing the patterned target material (or a microstructure in addition thereto) on the surface of the substrate and a portion of the surface of the substrate free of the target material. The portion of the surface of the substrate thus exposed together with the patterning is substantially free of the target material or microstructure, etc. Thus, the formation of a non-specific treated surface portion or a microstructure associated with the target material is inhibited or avoided. Alternatively, it substantially has the flatness or normality (e.g., free of particles) of the surface of the original substrate. For example, such a clean substrate surface can be bonded to another substrate or member to create a fluid-tight bonding surface. It is thus possible to fabricate a highly sealed flow channel or fluidic device.

Further aspects and advantages of the present disclosure will become readily apparent to those skilled in the art from the following detailed description, in which only exemplary embodiments of the present disclosure are shown and described. As will be understood, other different embodiments of the present disclosure can be made, and some details thereof can be modified in various obvious ways without departing from the present disclosure. Accordingly, the drawings and description are to be regarded as illustrative in nature and not as restrictive.

DESCRIPTION OF EMBODIMENTS

Referring to FIGS. 1A to 1K, a method for patterning a substrate, a method for forming a microstructure on a substrate, and a method for fabricating a fluidic device according to an embodiment of the present disclosure will be described. In the present embodiment, a nanowire of ZnO is grown in a patterned region, and a flow-channel device having the nanowire is fabricated. This is an example, and the present disclosure should not be construed as limited to this embodiment.

Figure 1A:
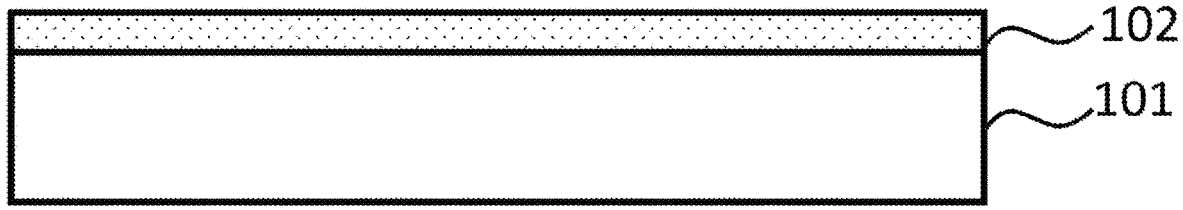
FIG. 1A is a cross-sectional view of a substrate for illustrating a method for patterning a substrate according to an embodiment.

As illustrated in FIG. 1A, a substrate 101 is provided, and a hydrophobic film 102 is formed on a surface thereof. The substrate 101 is typically a silicon substrate or a glass substrate used in a semiconductor process. The substrate 101 may be cleaned in advance. Contaminants or particles can thereby be removed from the surface. The hydrophobic film 102 can be formed by spin coating. The hydrophobic film 102 formed by coating is baked. As the hydrophobic film 102, Cytop (registered trademark, available from AGC Inc.) was used in examples.

Figure 1B:
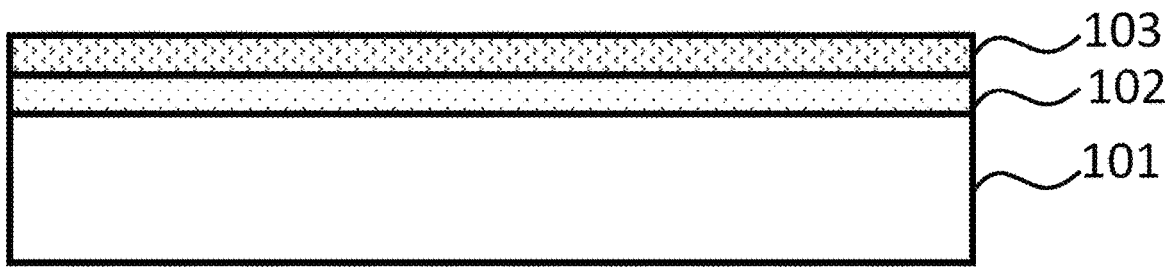
FIG. 1B is a cross-sectional view of a substrate for illustrating a method for patterning a substrate according to an embodiment.

As illustrated in FIG. 1B, a photoresist 103 is applied on the hydrophobic film 102. As the photoresist 103, a material used in a semiconductor process can be used. In examples, AZ4903 (available from Merck Performance Materials GmbH) was used.

Figure 1C:
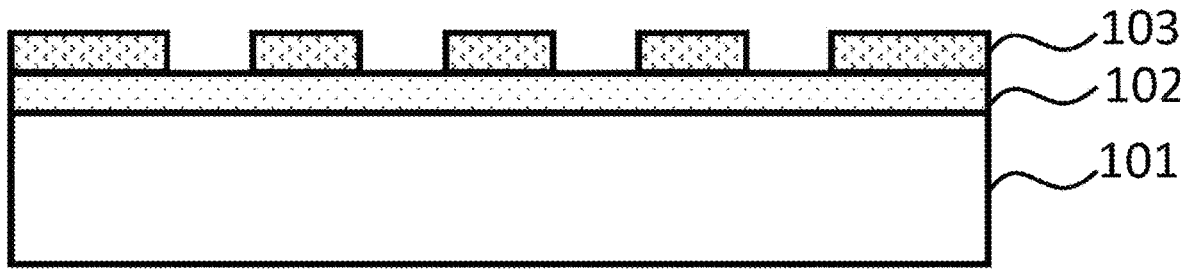
FIG. 1C is a cross-sectional view of a substrate for illustrating a method for patterning a substrate according to an embodiment.

As illustrated in FIG. 1C, the photoresist 103 is patterned. The photoresist 103 is prebaked. Exposure is performed so as to correspond to a pattern in which a target material will be formed later. Thereafter, development is performed. For the development, for example, NMD-3 (available from Tokyo Ohka Kogyo Co., Ltd.) may be used. Subsequently, the substrate is rinsed with pure water and dried by nitrogen blowing. Finally, the photoresist 103 is post-baked. Thereby, the photoresist 103 has been patterned.

Figure 1D:
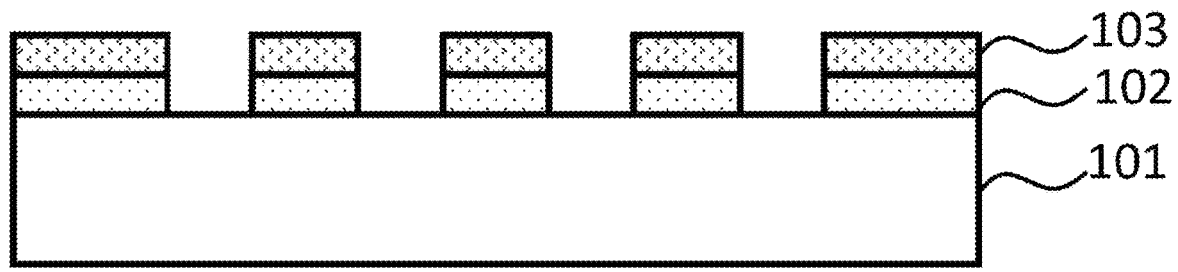
FIG. 1D is a cross-sectional view of a substrate for illustrating a method for patterning a substrate according to an embodiment.

As illustrated in FIG. 1D, portions of the hydrophobic film 102 that have been opened or exposed in FIG. 1C are etched. The hydrophobic film 102 may be subjected to oxygen etching. For example, the etching apparatus may be an apparatus used in a typical semiconductor process. In examples, an RF plasma apparatus, TEP-01C2 ((available from Tateyama Machine Co., Ltd.) was used. As a result, portions of the hydrophobic film 102 defined by the openings of the photoresist 103 were removed, and a portion of the surface of the substrate 101 was exposed.

Figure 1E:
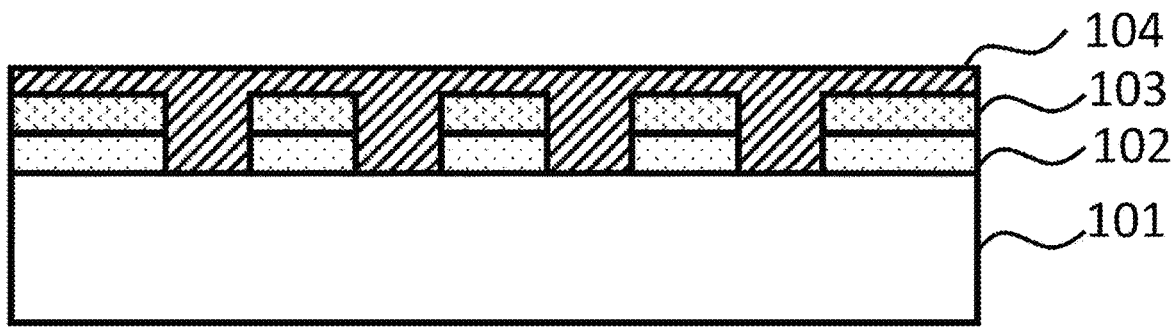
FIG. 1E is a cross-sectional view of a substrate for illustrating a method for patterning a substrate according to an embodiment.

As illustrated in FIG. 1E, a target material 104 is applied or deposited to cover the entire substrate 101, i.e., the surfaces of the photoresist 103, including the portion of the surface of the substrate 101 exposed in FIG. 1D. In the present embodiment, chromium (Cr) was deposited as the target material 104 by sputter deposition to a thickness of more than 100 nm.

Figure 1F:
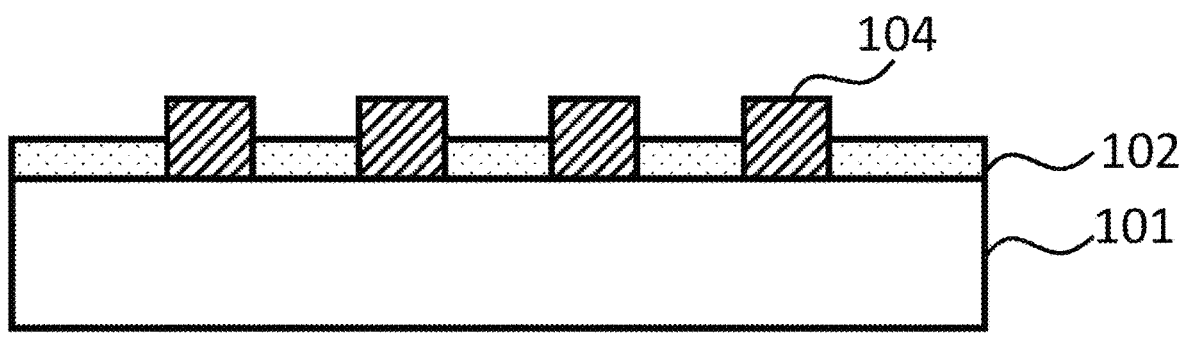
FIG. 1F is a cross-sectional view of a substrate for illustrating a method for patterning a substrate according to an embodiment.

As illustrated in FIG. 1F, the photoresist 103 and the target material 104 deposited on the photoresist 103 are removed by a lift-off process. In the present embodiment, the entire substrate 101 is immersed in heated 2-propanol for a predetermined time. Thereafter, ultrasonic cleaning was performed. Thereby, the target material 104 (chromium) was patterned on the substrate 101, and the other portion of the surface of the substrate 101 were covered with the hydrophobic film 102.

Figure 1G:
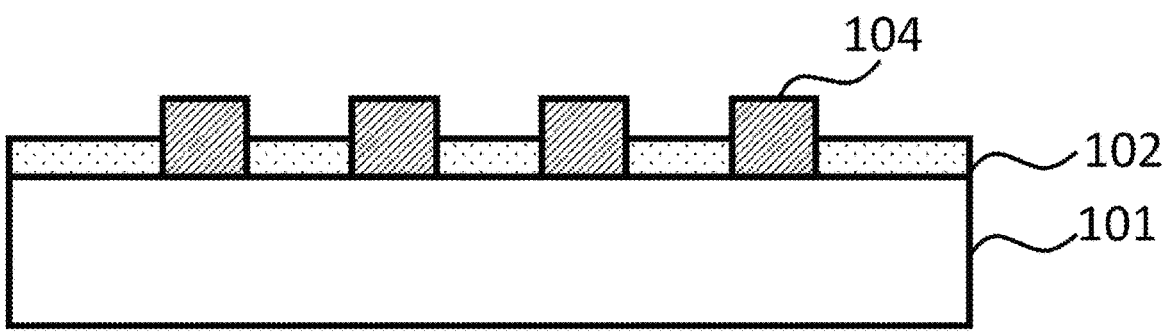
FIG. 1G is a cross-sectional view of a substrate for illustrating a method for patterning a substrate according to an embodiment.

As illustrated in FIG. 1G, the target material 104 is annealed. In the present embodiment, the target material 104, which was chromium, was maintained at 400° C. in the air atmosphere and oxidized. The air atmosphere contains a sufficient amount of oxygen for the oxidation of chromium. The atmosphere during heating may be an oxidizing atmosphere. The surface of chromium may be oxidized by plasma treatment.

Figure 1H:
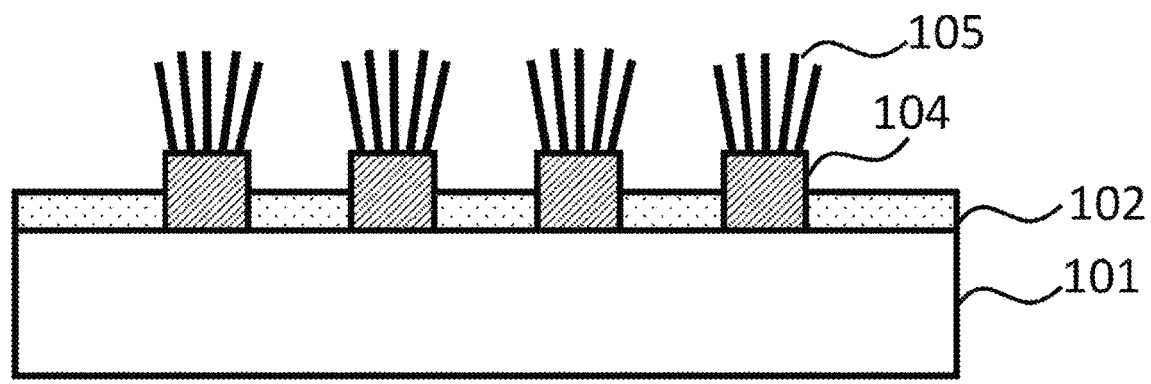
FIG. 1H is a cross-sectional view of a substrate for illustrating a method for patterning a substrate according to an embodiment.

As illustrated in FIG. 1H, ZnO nanowires 105 were grown as microstructures on the oxidized target material 104 (chromium). In the present embodiment, the ZnO nanowires 105 were formed by a hydrothermal synthesis method. If the hydrophobic film 102 does not cover the surface of the substrate 101, the nanowires 105 may also grow non-specifically on the surface of the substrate 101. As illustrated in FIG. 1H, since the hydrophobic film 102 covers the surface of the substrate 101, the nanowires 105 can grow only on the surfaces of the patterned target material 104.

Figure 1I:
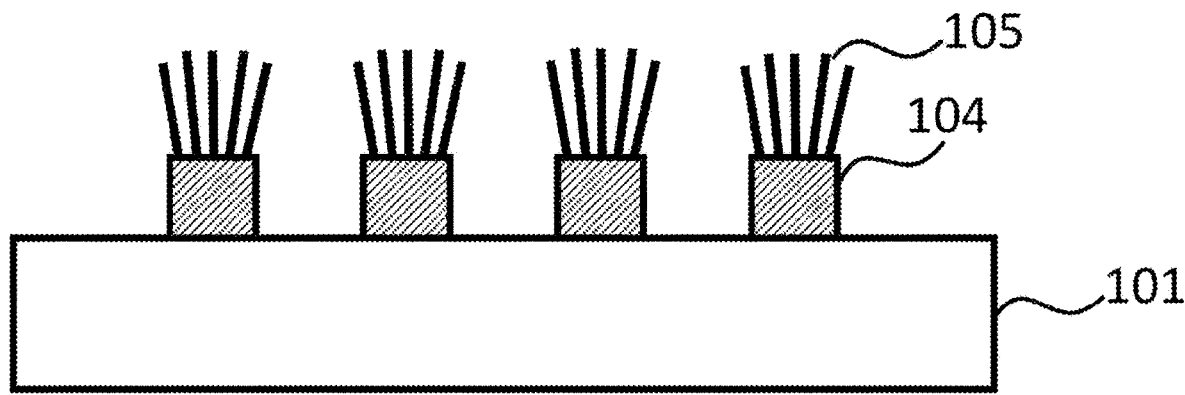
FIG. 1I is a cross-sectional view of a substrate for illustrating a method for patterning a substrate according to an embodiment.

Next, the hydrophobic film 102 is removed or lifted off. Thus, as illustrated in FIG. 1I, the substrate 101 includes the microstructures 105 (nanowires) formed at the positions of the target material 104 defined by the patterning. The microstructures 105 (nanowires) are not substantially present on the portion of the surface of the substrate 101 where the target material 104 is not present. In this way, the target material can be used as seed layers or starting points to form the microstructures only at the portions.

Figure 1J:
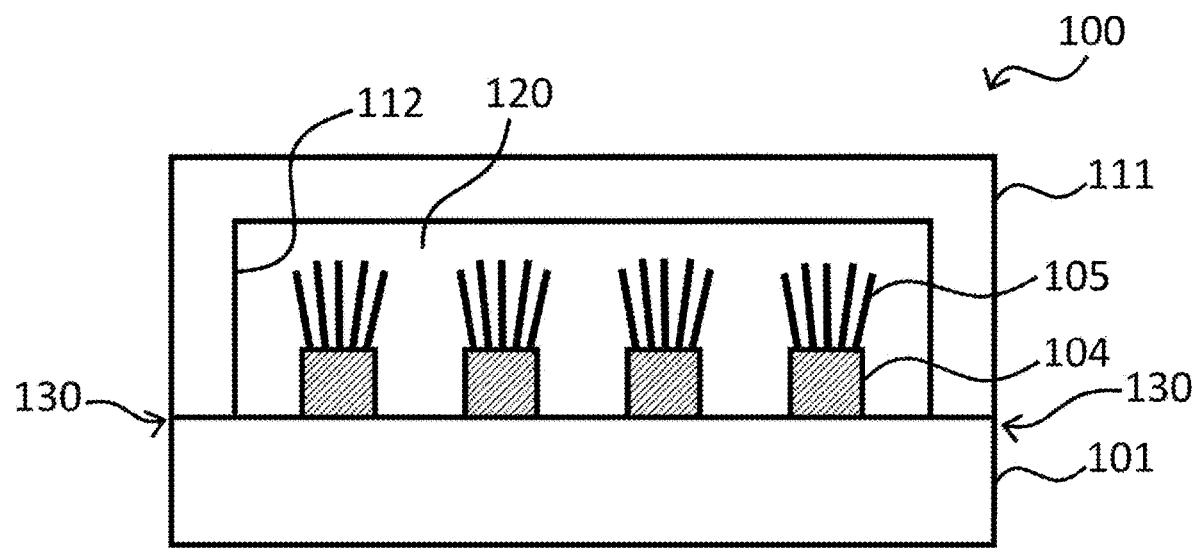
FIG. 1J is a cross-sectional view of a substrate for illustrating a method for patterning a substrate according to an embodiment.

In the present embodiment, a fluidic device 100 including the microstructures 105 formed as described above was fabricated. As illustrated in FIG. 1J, the fluidic device 100 mainly includes the substrate 101 and a cover (substrate) 111 bonded to the substrate 101. The substrate 101 is the substrate 101 illustrated in the FIG. 1I. The cover 111 includes a frame 112 and an internal space 120 surrounded by the frame 112 so as to cover the target material 104 and the microstructures 105 on the substrate 101. The frame 112 of the cover 111 is in close contact with the exposed portion of the surface of the substrate 101 where the microstructures 105 are not present, forming a bonding interface 130. The bonding interface 130 is highly fluid-tight. This is because the portion of surface of the substrate 101 forming the bonding interface 130 has no non-specific growth of the microstructure 105 or the like, and has a flat surface substantially similar to the initial surface.

In other words, the fluidic device 100 illustrated in FIG. 1J includes the substrate 101 having the target material 104 and the microstructures 105 thereon, and the cover 111 in close contact with the substrate 101 so as to enclose the microstructures 105. Alternatively, the substrate 101 and the cover 111 are in close contact with each other at the bonding interface 130 to form the internal space or a flow channel 120 containing the microstructures 105 therein.

In some embodiments, for example, as illustrated in FIG. 1J, the flow channel 120 may have a plurality of target material pattern portions 104 and/or the microstructures 105. In some embodiments, each flow channel may have a single target material pattern portion and/or a single microstructure. In some embodiments, a single target material pattern portion 104 and/or a single microstructure may be formed on the surface of the substrate. A cover having a single internal space may be bonded to the substrate.

In some embodiments, the surface of the substrate may include a plurality of target material pattern portions and/or microstructures. A fluidic device 200 illustrated in FIG. 2 includes a substrate 201 having on its surface a plurality of microstructures 204 and nanowires 205 formed on the surfaces of the microstructures, and a cover 211 closely bonded to the substrate 201. The cover 211 has a plurality of flow channels or internal spaces 220-1, 220-2, and 220-3, and is bonded to the substrate 201 at a bonding surface surrounding them to form a close contact surface 230. The flow channels 220-1, 220-2, and 220-3 are formed so as to contain the respective microstructures 204 and nanowires 205. As described above, the fluidic device 200 illustrated in FIG. 2 has the plurality of flow channels 220-1, 220-2, and 220-3.

In some embodiments, the fluidic device 200 may be cut along boundaries 240-1 and 240-2 of the flow channels 220-1, 220-2, and 220-3. As a result, a plurality of individual fluidic devices 200-1, 200-2, and 200-3 may be fabricated. In some embodiments, the cutting may include a blade or laser dicing process.

In some embodiments, after cutting the substrate 201, a cover may be brought into close contact with each individual substrate to fabricate individual fluidic devices (not illustrated).

Figure 2:
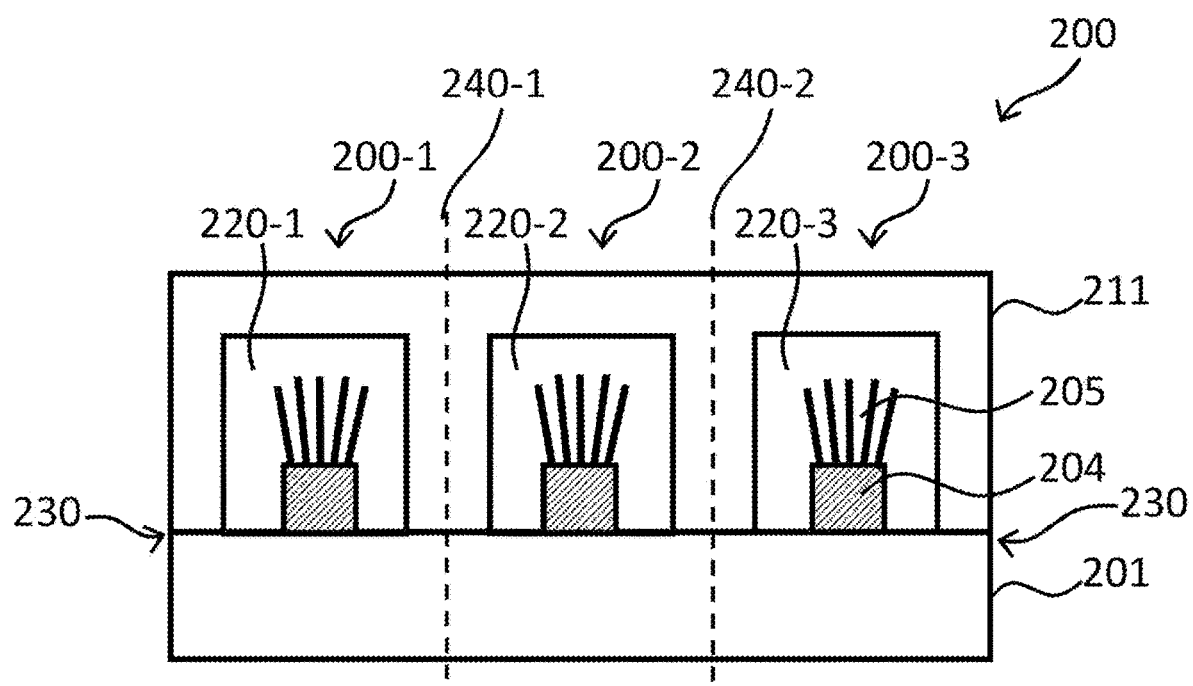
FIG. 2 is a cross-sectional view of a substrate for illustrating a method for patterning a substrate according to an embodiment.

While the formation or fabrication of three individual flow channels 220-1, 220-2, and 220-3 and three individual fluidic devices 200-1, 200-2, and 200-3 are illustrated in the embodiment of FIG. 2, the present disclosure is not limited thereto. For example, a plurality of flow channels and/or fluidic devices may be fabricated from one substrate. The number may be other than three.

In some embodiments, the cover may have a plurality of internal spaces and a plurality of frames surrounding the respective internal spaces (not illustrated). A cover having a plurality of internal spaces may be brought into close contact with a plurality of target material pattern portions and/or microstructures, and the bonded component of the substrate and the cover may be cut or separated according to each internal space.

The term "flow channel" used in this disclosure typically refers to a space for accommodating a fluid. The flow channel may also be used interchangeably with terms, such as a fluid chamber and a fluid container. The flow channel may have an inlet for introducing a fluid thereinto and/or an outlet for discharging a fluid therefrom. The fluid may flow within the flow channel, or may be introduced into the flow channel and substantially stopped.

In some embodiments, what is called a chaotic mixer (chaos mixer) or a structure that causes a nonlinear and/or three-dimensional flow of the fluid flowing through the flow channel may be arranged in the flow channel. Such a structure may have, for example, a step in the flow channel, a change in cross-sectional area, or a change in the direction of the flow channel.

A chaotic mixer having herringbone-shaped irregularities may be disposed on the inner wall surface of the flow channel (the surface of the substrate or the surface of the cover). These can promote the nonlinear flow of a fluid. As a result, for example, a larger amount of target substance in the solvent can be guided to the arranged microstructures (for example, nanowires) on the plurality of inner wall surfaces or the curved inner wall surfaces.

The fluidic device may detect, measure, analyze, modify, process, and/or capture a substance contained in a fluid introduced into the flow channel. The fluidic device may have the nanowires. The fluidic device may use the nanowires to capture a substance contained in a fluid. For example, the fluidic device may capture biomolecules in body fluids with the nanowires arranged in the flow channel.

In the present disclosure, a fluid introduced into the flow channel may be a body fluid. The term "body fluid" refers to a body fluid obtained from a subject or a sample derived from the body fluid. The body fluid may be, but is not limited to, blood, serum, plasma, lymph fluid, tissue fluid such as interstitial fluid (interstitial fluid), intercellular fluid, body cavity fluid, serous cavity fluid, pleural fluid, ascites fluid, pericardial fluid, cerebrospinal fluid (spinal fluid), joint fluid (synovial fluid), and aqueous humor (aqueous humor). The body fluid may be a digestive fluid such as saliva, gastric fluid, bile, pancreatic fluid, or intestinal fluid, or may be sweat, tears, nasal fluid, urine, semen, vaginal fluid, amniotic fluid, or milk. The body fluid may be an animal body fluid or a human body fluid.

The biomolecule may be an organelle or a vesicle. The vesicle may be, but is not limited to, a vacuole, a lysosome, a transport vesicle, a secretion, a gas vesicle, an extracellular matrix vesicle, an extracellular vesicle, or the like, and may include two or more thereof. The extracellular vesicle may be, but is not limited to, an exosome, an exotome, a shedding microvesicle, microvesicles, membrane particles, plasma membranes, pototic bullae, or the like. The vesicle may contain a nucleic acid.

The biomolecule may be or may contain, but is not limited to, a cell. The cell may be a red blood cell, a white blood cell, an immune cell, or the like. The biomolecule may be a virus, a bacterium, or the like.

The solution may be a body fluid or a liquid derived from a body fluid (such as a diluted liquid or a treated liquid). The solution may be a solution that is not a body fluid (derived from a non-body fluid), may be an artificially prepared liquid, or may be a mixture of a body fluid or a solution derived from a body fluid and a solution derived from a non-body fluid. The solution may be a solution used for sample measurement or may be a solution used for calibration measurement. For example, the solution may be a standard solution or a calibration solution. The sample to be measured may be a specimen. The solution may contain a physiological buffer, such as phosphate buffered saline (PBS) or N-tris(hydroxymethyl)methyl-2-aminoethanesulfonic acid buffer (TES), containing the material to be recovered.

The present disclosure also provides embodiments below.

A001

A method for patterning a target material over a substrate, including:
providing a substrate;
forming a hydrophobic film on a surface of the substrate;
patterning the hydrophobic film to expose a portion of the surface of the substrate;
applying an oxidizable target material to the portion of the surface of the substrate exposed by the patterning; and
heating the substrate including the oxidizable target material and the hydrophobic film or oxidizing the target material on the substrate.

A001b

A method for patterning a target material over a substrate, including:
providing a substrate;
forming a hydrophobic film on a surface of the substrate;
patterning the hydrophobic film to expose a portion of the surface of the substrate;
applying a target material to the portion of the surface of the substrate exposed by the patterning; and
surface-treating the substrate having the target material and the hydrophobic film.

A011

The method according to embodiment A001 or any embodiment, further including:
removing the hydrophobic film after heating the substrate or oxidizing the target material.

A012

The method according to embodiment A011 or any embodiment,
in which removing the hydrophobic film includes forming the patterned target material on the surface of the substrate.

A013

The method according to embodiment A011, A012, or any embodiment,
in which removing the hydrophobic film includes exposing a portion of the surface of the substrate to which the target material has not been applied.

A015

The method according to any one of embodiments A001 to A013 or any embodiment,
in which the hydrophobic film is formed of a fluorine compound.

A016

The method according to embodiment A015 or any embodiment,
in which removing the hydrophobic film includes removing the heated or oxidized fluorine compound using ultrasonic cleaning.

A021

The method according to embodiment A0012, any one of embodiments A013 to A016 referring to embodiment A012, or any embodiment, further including:
forming a flow channel on the substrate to include the patterned target material therein.

A022

The method according to embodiment A021 or any embodiment,
in which forming the flow channel on the substrate includes bringing a flow channel member having at least a portion of the flow channel into close contact with the surface of the substrate.

A023

The method according to embodiment A022 or any embodiment,
in which the flow channel member defining the flow channel and the surface of the substrate are in close contact with each other.

A031

The method according to any one of embodiments A001 to A033 or any embodiment,
in which the substrate contains a semiconductor, glass, a metal, or a polymer on at least the surface thereof.

A041

The method according to any one of embodiments A011 to A031 or any embodiment, further including:
treating a surface of the target material before removing the hydrophobic film.

A042

The method according to any one of embodiments A011 to A031 or any embodiment, further including:
forming a microstructure on a surface of the target material before removing the hydrophobic film.

A043

The method according to embodiment A042 or any embodiment,
in which the microstructure is a nanowire.

A044
The method according to embodiment A042 or A043 or any embodiment,
in which the microstructure has an ability to capture a biomolecule.

A051
The method according to any one of embodiments A001 to A044 or any embodiment,
in which the target material is a metal.

A052
The method according to embodiment A051 or any embodiment,
in which the target material is chromium.

A053
The method according to embodiment A043 or any embodiment,
in which the target material is chromium, and
forming the microstructure on the surface of the target material includes forming the nanowire containing ZnO on an oxidized surface of the chromium.

A061
The method according to any one of embodiments A001 to A053 or any embodiment,
in which patterning the hydrophobic film to expose the portion of the surface of the substrate includes applying a photomask over the hydrophobic film and patterning the photomask, and
applying the oxidizable target material to the portion of the surface of the substrate exposed by the patterning includes applying the target material over the applied and patterned photomask and removing the photomask and the target material.

A062
The method according to embodiment A061 or any embodiment,
in which removing the photomask and the target material is removing the photomask and the target material by a lift-off process.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations, or equivalents. It is intended that the following claims define the scope of the invention and that methods and structures within the scope of these claims and their equivalents be covered thereby.

What is claimed is:

1. A method for patterning a target material over a substrate, comprising:
providing a substrate;
forming a hydrophobic film on a surface of the substrate;
patterning the hydrophobic film to expose a portion of the surface of the substrate;
applying a target material to the portion of the surface of the substrate exposed by the patterning such that the hydrophobic film is exposed at another portion of the surface of the substrate;
oxidizing the target material on the substrate;
forming a microstructure on a surface of the oxidized target material before removing the hydrophobic film; and
removing the hydrophobic film after said forming of the microstructure.

2. The method according to claim 1,
wherein removing the hydrophobic film includes exposing a portion of the surface of the substrate to which the target material has not been applied.

3. The method according to claim 1,
wherein the hydrophobic film is composed of a fluorine compound.

4. The method according to claim 1, further comprising:
forming a flow channel on the substrate so as to include the target material therein and the microstructure.

5. The method according to claim 4,
wherein forming the flow channel on the substrate includes bringing a flow channel member having at least a portion of the flow channel is formed into contact with the surface of the substrate.

6. The method according to claim 1,
wherein the substrate contains a semiconductor, glass, a metal, or a polymer on at least the surface thereof.

7. The method according to claim 1,
wherein the microstructure is a nanowire.

8. The method according to claim 1,
wherein the microstructure has an ability to capture a biomolecule.

9. The method according to claim 1,
wherein the target material is chromium.

10. The method according to claim 1,
wherein the target material is chromium, and
wherein forming the microstructure on the surface of the target material includes forming a nanowire containing ZnO on an oxidized surface of the chromium.

11. The method according to claim 1,
wherein patterning the hydrophobic film to expose the portion of the surface of the substrate includes applying a photomask over the hydrophobic film and patterning the photomask, and
wherein applying the target material to the portion of the surface of the substrate exposed by the patterning includes applying the target material over the applied and patterned photomask and removing the photomask and the target material.

12. The method according to claim 11,
wherein removing the photomask and the target material includes removing the photomask and the target material by a lift-off process.

* * * * *